US008174676B2

(12) United States Patent
Ulrich et al.

(10) Patent No.: US 8,174,676 B2
(45) Date of Patent: May 8, 2012

(54) METHOD FOR CORRECTING A LITHOGRAPHY PROJECTION OBJECTIVE, AND SUCH A PROJECTION OBJECTIVE

(75) Inventors: Wilhelm Ulrich, Aalen (DE); Thomas Okon, Aalen (DE); Norbert Wabra, Werneck (DE); Toralf Gruner, Aalen-Hofen (DE); Boris Bittner, Roth (DE); Volker Graeschus, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/187,003

(22) Filed: Jul. 20, 2011

(65) Prior Publication Data
US 2011/0279803 A1 Nov. 17, 2011

Related U.S. Application Data

(63) Continuation of application No. 11/479,574, filed on Jun. 30, 2006, now abandoned.

(60) Provisional application No. 60/696,118, filed on Jul. 1, 2005.

(51) Int. Cl.
*G03B 27/70* (2006.01)
(52) U.S. Cl. .............................. 355/66; 355/53; 355/77
(58) Field of Classification Search .............. 355/53, 355/66, 77; 359/726, 728
See application file for complete search history.

(56) References Cited

U.S. PATENT DOCUMENTS

| 5,117,255 A | 5/1992 | Shiraishi et al. |
| 5,148,314 A | 9/1992 | Chen |
| 5,223,982 A * | 6/1993 | Suzuki et al. ............... 359/716 |
| 5,392,119 A | 2/1995 | McArthur et al. |
| 5,682,226 A | 10/1997 | Anzai et al. |
| 5,757,017 A | 5/1998 | Braat |
| 6,157,498 A | 12/2000 | Takahashi |
| 6,262,793 B1 | 7/2001 | Sasaya et al. |

(Continued)

FOREIGN PATENT DOCUMENTS

EP 0 724 199 7/1996

(Continued)

OTHER PUBLICATIONS

Machine translation of Japanese publication 2005-064310, Mar. 10, 2005.*

(Continued)

*Primary Examiner* — Hung Henry Nguyen
*Assistant Examiner* — Steven H Whitesell Gordon
(74) *Attorney, Agent, or Firm* — Fish & Richardson P.C.

(57) ABSTRACT

A method for correcting at least one image defect of a projection objective of a lithography projection exposure machine, the projection objective comprising an optical arrangement composed of a plurality of lenses and at least one mirror, the at least one mirror having an optically operative surface that can be defective and is thus responsible for the at least one image defect, comprises the steps of: at least approximately determining a ratio VM of principal ray height $h_MH$ to marginal ray height $h_MR$ at the optically operative surface of the at least one mirror, at least approximately determining at least one optically operative lens surface among the lens surfaces of the lenses, at which the magnitude of a ratio VL of principal ray height $h_LH$ to marginal ray height $h_LR$ comes at least closest to the ratio VM, and selecting the at least one determined lens surface for the correction of the image defect.

21 Claims, 7 Drawing Sheets

U.S. PATENT DOCUMENTS

| | | |
|---|---|---|
| 6,266,389 B1 | 7/2001 | Murayama et al. |
| 6,268,903 B1 | 7/2001 | Chiba et al. |
| 6,333,776 B1 | 12/2001 | Taniguchi |
| 6,366,389 B1 | 4/2002 | Wraback et al. |
| 6,388,823 B1 | 5/2002 | Gaber et al. |
| 6,522,386 B1 | 2/2003 | Nishi |
| 6,545,746 B1 | 4/2003 | Nishi |
| 6,636,350 B2 | 10/2003 | Shafer et al. |
| 2001/0043391 A1 | 11/2001 | Shafer et al. |
| 2002/0030799 A1* | 3/2002 | Iwasaki et al. .......... 355/53 |
| 2002/0171048 A1 | 11/2002 | Braat |
| 2002/0171815 A1 | 11/2002 | Matsuyama et al. |
| 2003/0197922 A1 | 10/2003 | Hudyma |
| 2004/0169836 A1 | 9/2004 | Wegmann |
| 2004/0246595 A1 | 12/2004 | Beach |
| 2005/0190435 A1* | 9/2005 | Shafer et al. .......... 359/365 |
| 2007/0019305 A1 | 1/2007 | Ulrich et al. |
| 2008/0123069 A1 | 5/2008 | Wabra et al. |

FOREIGN PATENT DOCUMENTS

| | | |
|---|---|---|
| EP | 0 833 180 | 9/1997 |
| EP | 0 824 721 | 7/2000 |
| EP | 1 024 522 | 8/2000 |
| EP | 1 306 698 | 5/2003 |
| EP | 1 318 425 | 6/2003 |
| EP | 1 336 887 | 8/2003 |
| EP | 1 369 608 | 12/2003 |
| EP | 1 630 585 | 3/2006 |
| JP | 10-154657 | 6/1998 |
| JP | 2002-250865 | 9/2002 |
| JP | 2002-258131 | 9/2002 |
| JP | 2005-064310 | 3/2005 |
| WO | WO 01/55767 | 8/2001 |
| WO | WO 02/44786 | 6/2002 |
| WO | WO 2004/010164 | 1/2004 |
| WO | WO 2004/019128 | 3/2004 |
| WO | WO 2004/107011 | 12/2004 |
| WO | WO 2005/121899 | 12/2005 |

OTHER PUBLICATIONS

Hofmann et al., "Nanometer-Aspären: Wie herstellen und wofür?", 1991, 4 pages (with English abstract).

Besenmatter, "Analyse der primären Wirkung asphärischer Flächen mit Hilfe des Delano-Diagramms," "EUMIG, Optik-Entwicklung, A-2351 Wiener Neudorf, Osterreich", (Excerpt), 1978, 7 pages (with English abstract).

* cited by examiner

METHOD FOR CORRECTING A LITHOGRAPHY PROJECTION OBJECTIVE, AND SUCH A PROJECTION OBJECTIVE

CROSS-REFERENCE TO RELATED APPLICATIONS

This application is a continuation of, and claims benefit under 35 USC 120 to, U.S. application Ser. No. 11/479,574, filed Jun. 30, 2006, which claims priority to U.S. provisional patent application No. 60/696,118, filed Jul. 1, 2005. The contents of both of these applications are hereby incorporated by reference in its entirety.

BACKGROUND OF THE INVENTION

The invention relates to a method for correcting at least one image defect of a projection objective of a lithography projection exposure machine, the projection objective comprising an optical arrangement composed of a plurality of lenses and at least one mirror.

The invention further relates to such a projection objective.

Projection objectives of the above-named type are used in the lithographic, in particular microlithographic production of semiconductors, in the case of which an object provided with a structure, that is also denoted as reticle, is imaged by means of the projection objective onto a carrier, which is denoted as a wafer. The carrier is provided with a photosensitive layer upon the exposure of which by means of light through the projection objective the structure of the object is transferred onto the photosensitive layer. After development of the photosensitive layer, the desired structure is produced on the carrier, the exposure operation being repeated in multiple fashion in some circumstances.

A projection objective that is used in the case of such a method and has an optical arrangement composed of a number of lenses and at least one mirror is also denoted as catadioptric. Such a catadioptric projection objective is described, for example, in document WO 2004/019128 A2.

Among the high-aperture projection objectives, catadioptric projection objectives are gaining evermore in importance since, by comparison with purely refractive (dioptric) projection objectives, they enable an overall economic compromise for the purpose of fulfilling the manifold customer-specific requirements.

The at least one, and the frequently several mirrors of such catadioptric projection objectives can be subdivided into two classes, specifically those with catoptric power and those without catoptric power. The mirrors with catoptric power serve the purpose chiefly of supplying a dispersion-free catoptric power and a suitable, mostly positive contribution to the correction of the image surface. It is possible thereby to save a number of lenses by comparison with classic, purely refractive designs. Mirrors without catoptric power, which are also termed folding mirrors, serve the purpose of beam guidance and are generally necessitated on the basis of design requirements.

Within the meaning of the present invention, the at least one mirror can be a mirror with or without catoptric power.

A problem with catadioptric projection objectives is the narrow tolerance requirements placed on the optically operative surfaces of the mirrors. These narrow tolerance requirements are caused by the fact that the optical effect of a surface deformation of a mirror is more than twice as large as is the case with the surface of a lens. The reason for this is that a deformation Δz of a mirror is traversed by the incident and the reflected light beams, that is to say twice, while a surface deformation Δz of a lens surface is traversed only once, and moreover a lens has a refractive index of usually >1.

The surface failures of mirrors can be caused by inaccuracies in production, or by layer stresses of the mirror coatings. Failures can also occur in removing and installing mirrors because of the impossibility of always ensuring exact reproducibility of the previous installed position. Deformations owing to layer stresses frequently occur for the fact that the coating and the substrate of the mirror have different coefficients of thermal expansion such that the shape of the mirror is changed upon irradiation with light. A similar effect can occur owing to relaxation processes after coating the substrate of the mirror.

The use of mirrors in projection objectives consequently requires a higher outlay on adjustment in order to do justice to the deformations of the mirrors used that are unknown before the assembly of the projection objective.

Defective mirror surfaces lead to wavefront errors in the projection light, and thus to a defective imaging of the object (reticle) onto the carrier (wafer) that cannot be sustained in view of the currently required miniaturization of the semiconductor structures to be produced.

There is thus a need for a suitable method for correcting such wavefront errors, i.e. image defects of a catadioptric projection objective, and for a catadioptric projection objective that is at least largely error-compensated.

One possibility for compensating image defects of a catadioptric projection objective that are caused by one or more defective mirrors could consist in correcting the defective mirror surface or surfaces directly by means of a local aspherization by polishing or ion beam etching. However, this sometimes turns out to be very complicated, since the defective mirror or mirrors need to be removed and reinstalled from and in the projection objective several times in some circumstances, and this places particularly high requirements on the adjustment of the reinstalled mirror or mirrors. In addition, as already mentioned the optical effect of defects of mirrors is substantially greater than the optical effect of defects of lenses. Moreover, because of engineering in accuracy in the aspherization process on mirror surfaces it is frequently not even possible for the mirror surface to be corrected directly.

An alternative possibility to this end consists in aspherizing an optically operative lens surface in the immediate neighborhood of the relevant defective mirror.

However, this mode of procedure is not possible for all designs of catadioptric projection objectives, since it is not always ensured that lenses are located in the immediate vicinity of the relevant mirror, as is the case with the projection objective in accordance with WO 2002/044786 A2, FIG. 1. Furthermore, the case can also occur where suitable lenses are certainly present but are not suitable for aspherization for reasons of design type.

It follows that there is a further need for a suitable method for correcting at least one aberration of a catadioptric projection objective, and for an error-compensated catadioptric projection objective whose aberrations are caused by defects in one or more mirror surfaces.

SUMMARY OF THE INVENTION

It is an object of the present invention to provide an improved method for correcting at least one image defect of a catadioptric projection objective.

A further object of the invention is to specify an improved catadioptric projection objective in the case of which image defect that are caused by at least one defective mirror are at least diminished.

In accordance with a first aspect of the invention, a method for correcting at least one image defect of a projection objective of a lithography projection exposure machine is provided, the projection objective comprising an optical arrangement composed of a plurality of lenses and at least one mirror, the at least one mirror having an optically operative surface that can be defective and is thus responsible for the at least one aberration, comprising the steps of:

at least approximately determining a ratio VM of principal ray height $h_M H$ to marginal ray height $h_M R$ at the optically operative surface of the at least one mirror, at least approximately determining at least one optically operative lens surface among the lens surfaces of the lenses, at which the magnitude of a ratio VL of principal ray height $h_L H$ to marginal ray height $h_L R$ comes at least closest to the ratio VM, preferably determining this optically active lens surface such that VL additionally has the same sign as VM.

Selecting the at least one determined lens surface for the correction of the image defect.

In accordance with a further aspect of the invention, provision is made for a projection objective of a lithography projection exposure machine, comprising an optical arrangement composed of a plurality of lenses and at least one mirror, wherein the at least one mirror has an optically operative surface that can cause at least one image defect of the optical arrangement, and wherein for the correction of the image defect at least one optically operative lens surface among the lens surfaces of the lenses is selected, at which the magnitude of a ratio VL of principal ray height $h_L H$ to marginal ray height $h_R L$ comes at least closest to a ratio VM of principal ray height $h_M H$ to marginal ray height $h_M R$ at the optical active surface of the at least one mirror, preferably selected such that VL additionally has the same sign as VM.

The invention proceeds from the idea that it need not be absolutely necessary to correct the defect or deformation of the at least one defective mirror itself or in the vicinity of the mirror, but that it suffices to compensate their optical effect. This compensation, for example the optical effect of an aspherization of an optically operative surface, is a function not only of the shape of the local aspherization, but is also determined by the position of the optical surface in the projection optics. The ratio of principal ray height to marginal ray height on the optical surface in the projection objective is important for the dependence of the optical effect, for example, of an aspherization of the position of said optical surface. Principal ray height is understood as the ray height of the principal ray of a field point of the object field having maximum field height in absolute terms. Marginal ray height is the height of a ray of maximum aperture emanating from the middle of the object field.

An "optically operative surface" within the meaning of the present invention is to be understood in general, and such a surface of a mirror can be focusing, defocusing or merely beam-guiding (beam folding). An optically operative surface is generally that surface which is used by the light in the installed state of the mirror in the projection objective.

The invention is based on the fact that the first step in optimally selecting the at least one lens surface provided for compensating the wavefront error caused by a deformation of the at least one mirror is to determine the position of the mirror inside the projection objective with the aid of the—signed—ratio of principal ray height to marginal ray height on the optically operative surface of the mirror. The further step then consists in selecting for the compensation or correction of the aberration at least one optically operative lens surface among the surfaces of the lenses at which the ratio of principal ray height to marginal ray height comes as close as possible to the ratio of principal ray height to marginal ray height at the optically operative mirror surface, or is even the same. In other words, for the purpose of correcting the image defect a lens surface that is at least approximately conjugate to the defective mirror surface is selected that need not necessarily be adjacent to the mirror.

In further preferred refinements of the invention, the correction of the at least one image defect is carried out by providing the at least one lens surface, selected as previously described, with an aspherization, or at least one lens that has the selected lens surface is assigned an actuator such that the at least one image defect can be corrected by means of a positional adjustment, for example by tilting or displacement, or by rotation in a plane perpendicular to the optical axis of the lens, or by a combination of these positional adjustments, and/or the at least one lens, which has the selected lens surface, is assigned an actuator such that the at least one aberration can be corrected by a deformation of the lens.

Further advantages and features of the invention can be gathered from the description below of preferred exemplary embodiments in conjunction with the attached drawing.

BRIEF DESCRIPTION OF THE DRAWINGS

Selected exemplary embodiments of the invention are illustrated in the drawings and are described in more detail below with reference thereto. In the drawings.

DETAILED DESCRIPTION OF PREFERRED EXEMPLARY EMBODIMENTS

Figure 1:
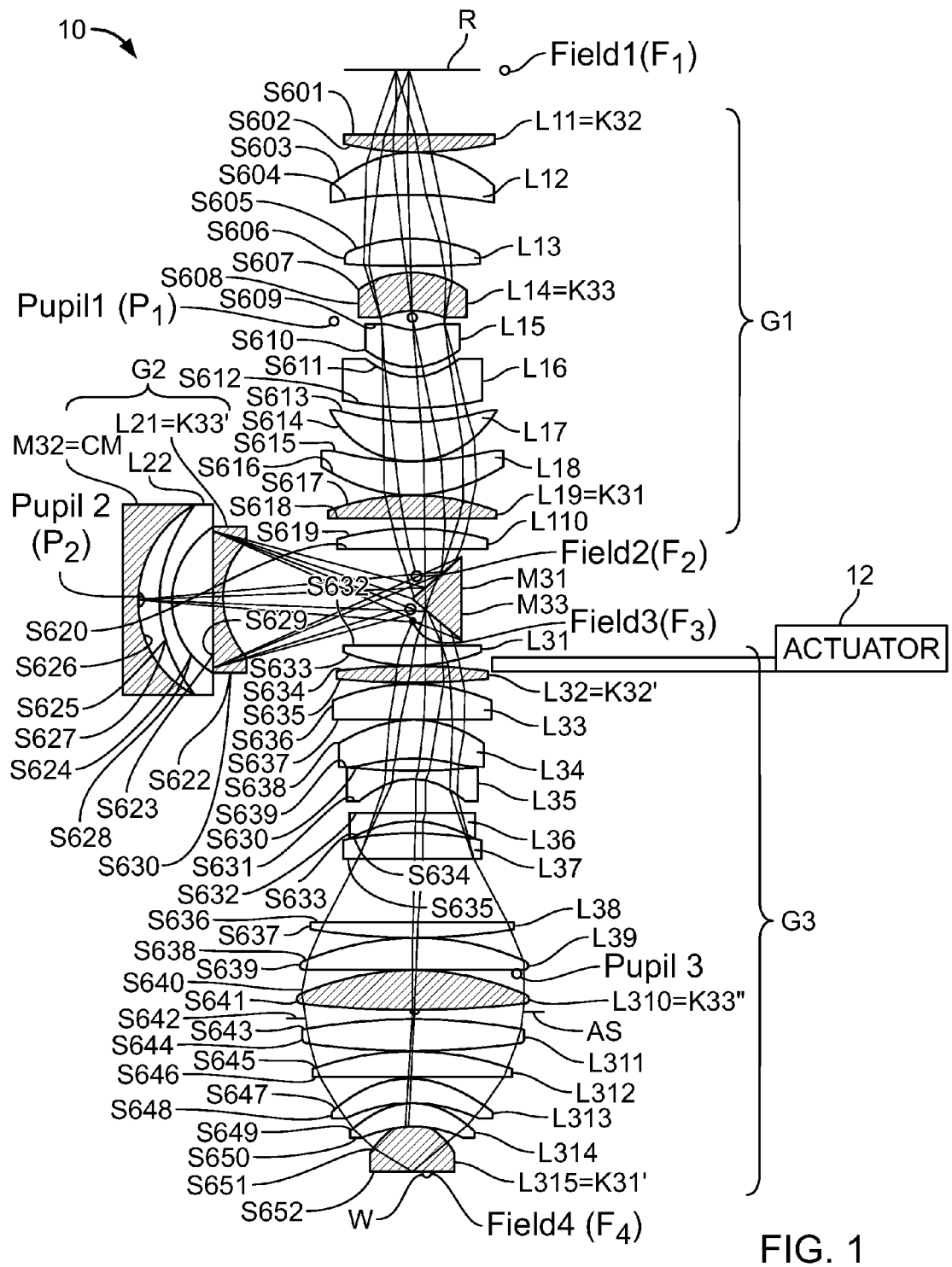
FIG. 1 shows a catadioptric projection objective in accordance with a first exemplary embodiment.

Before going into the figures in more detail, the method for correcting at least one image defect of a catadioptric projection objective of a lithography projection exposure machine is firstly described in general.

A catadioptric projection objective has an optical arrangement composed of a plurality of lenses and at least one mirror.

Owing to the manufacturing process, the at least one mirror can have a defective optically operative surface that is responsible for the at least one image defect.

During the process, the position of the optically operative surface of the at least one mirror inside the projection objective is firstly determined.

This determination is performed with the aid of the ratio VM of principal ray height $h_M H$ to marginal ray height $h_M R$ on the optically operative surface of the at least one mirror.

The principal ray height is understood as the height of the principal ray of a field point of the object field with a maximum field height. Marginal ray height is understood as the height of a ray with maximum aperture emanating from the middle of the object field.

After the ratio VM of principal ray height $h_M H$ to marginal ray height $h_M R$ is determined at the possibly defective optically operative surface of the at least one mirror, at least one optically operative lens surface that is at least approximately conjugate to the optically operative mirror surface is determined from among the totality of the surfaces of the lenses present in the projection objective at which, thus, the magnitude of a ratio VL of principal ray height $h_L H$ to marginal ray height $h_M R$ comes at least close to the ratio VM, and deviates from this, for example, by less than 20%, preferably less than 15%, and further preferably less than 10%.

It is particularly preferred to select the above at least one at least approximately conjugate optically operative lens surface in such a way that the sign of VL corresponds to that of VM in addition, as well.

Determination of the ratio of principal ray height to marginal ray height at the individual optically operative surfaces of the projection objective follows from the design data of the projection objective such as lens curvatures, lens material, mirror curvatures, mutual spacing of the optical elements, object position, image plane position as well as aperture size and field size.

In order to determine the position of the optically operative surface of the at least one mirror of the projection objective, and also in order to determine the at least one optically operative lens surface for correcting the image defects caused by the possibly defective optically operative surface of the at least one mirror, it is sometimes sufficient instead of determining the ratio VM or VL exactly to determine whether the corresponding optically operative surfaces are near-pupil or near-field surfaces.

Here, an optically operative surface can be denoted as near-pupil or, synonymously, as lying in the vicinity of a pupil plane when the magnitude of the ratio V of principal ray height to marginal ray height on the surface is less than 1/n, and an optically operative surface can be denoted as near-field or, synonymously, as lying in the vicinity of a field plane when the magnitude of the ratio V of principal ray height to marginal ray height on this surface is greater than n/10. Here, the value 5, preferably 10, very preferably 20 is to be selected for the parameter n. An optically operative element is denoted as near-pupil or as lying in the vicinity of a pupil plane when at least one of its optically operative surfaces lies near a pupil. An optically operative element is denoted as near the field or as lying in the vicinity of a field plane when at least one of its optically operative surfaces lies near a field.

It is therefore sufficient for the purpose of the invention firstly to determine the pupil planes and the field planes of the projection objective. The former are at least approximately the planes perpendicular to the optical axis where roughly all the principal rays of all field points that do not lie on the optical axis cross the optical axis. That is to say, the above ratio V of principal ray height to marginal ray height is approximately zero. The latter are at least approximately the planes perpendicular to the optical axis, where all the aperture rays belonging to the respective field points are united at least approximately for all the field points. That is to say, the above ratio V of principal ray height to marginal ray height lies—in terms of magnitude—approximately at infinity. The latter are split up into object plane, intermediate images and image plane.

The sign of the ratio V of principal ray height to marginal ray height changes with each passage through a pupil plane or a field plane.

With reference to FIG. 1, a first exemplary embodiment of a projection objective is now described in the case of which the method according to the invention is applied.

The projection objective is provided in FIG. 1 with the general reference numeral 10. Reference is made to the above-named document WO 2004/019128 A2 in relation to a detailed description of the projection projective 10.

The projection objective 10 has three lens groups and three mirrors, the first lens group having lenses $L_{11}$ to $L_{110}$, the second lens group having lenses $L_{21}$ and $L_{22}$, and the third lens group having lenses $L_{31}$ to $L_{315}$.

$M_{31}$ and $M_{33}$ indicate two folding mirrors that are plane, and CM (=$M_{32}$) denotes a concave mirror. R denotes the object plane or reticle plane, and W denotes the image plane or wafer plane.

The projection objective 10 in FIG. 1 has four field planes $F_1$ to $F_4$, specifically the object field $F_1$, the field $F_2$ between the folding mirror $M_{31}$ and the mirror CM, close to the folding mirror $M_{31}$, a field $F_3$ between the mirror CM and the folding mirror $M_{33}$, near the mirror $M_{32}$ and the image field $F_4$.

Furthermore, the projection objective 10 in FIG. 1 has three pupil planes, specifically a pupil plane $P_1$ between the lenses $L_{14}$ and $L_{15}$, a pupil plane $P_2$ on the mirror CM and a pupil plane $P_3$ between lenses $L_{310}$ and $L_{311}$.

The mirror CM is therefore stationed in the vicinity of a pupil plane in which by definition the ratio of principal ray height to marginal ray height is approximately 0. Its possible surface deformations that give rise to image defects can be corrected by selecting for the correction at least one lens surface of the lenses $L_{11}$ to $L_{315}$ that are arranged in the vicinity of one of the three pupil planes $P_1$ to $P_3$. In the case of the projection objective 10, the following preferably come into consideration as such lens surfaces:

the lens surface $S_{608}$ of lens $L_{14}$,
the lens surface $S_{609}$ of lens $L_{15}$,
the lens surface $S_{623,626}$ of lens $L_{21}$,
the lens surface $S_{625,627}$ of lens $L_{22}$,
the lens surface $S_{641}$ of lens $L_{310}$ and/or
the lens surface $S_{643}$ of lens $L_{311}$.

By contrast, the two folding mirrors $M_{31}$ and $M_{33}$ are stationed in the vicinity of the field planes $F_2$ and $F_3$ and are separated from one another by the pupil plane $P_2$ and the field planes $F_2$ and $F_3$. It follows therefrom that the ratio $h_M H / h_M R$ on the surfaces of the mirrors $M_{31}$ and $M_{33}$ are comparable in terms of magnitude, but differ in terms of sign. Consequently, it is necessary to provide at least two further optically operative lens surfaces for the aspherization.

The lens surface $S_{620}$ of the lens $L_{110}$ or the lens surface $S_{618}$ of the lens $L_{19}$ can be selected, or the lens surface $S_{652}$ of the lens $L_{315}$ can be selected for correcting or compensating surface deformations of the folding mirror $M_{31}$.

The lens surface $S_{632}$ of the lens $L_{31}$ or the lens surface $S_{634}$ of the lens $L_{32}$ or else, for example, the lens surface $S_{601}$ or the lens surface $S_{602}$ of the lens 11, at which the ratio of principal ray height to marginal ray height is suitable both in terms of magnitude and in terms of sign can be selected for correcting or compensating surface deformations of the folding mirror $M_{33}$.

If, thus, only respectively one individual lens surface is selected for correcting an individual mirror surface, this results in ten possibilities for combining lens surfaces that can be selected for correcting deformations of the mirrors $M_{31}$, $M_{33}$ and CM. The correction of the image defects caused by deformations of the mirrors $M_{31}$, $M_{33}$ and CM can be performed by providing aspherizations on the above-named selected lens surfaces or on individual ones of these lens surfaces.

In addition, the lenses associated with the above-named lens surfaces can be provided with actuators (not illustrated) such that these lenses can easily be adjusted in position, for example by tilting or displacement, or by rotation in a plane perpendicular to the optical axis, or by a combination of these positional adjustments of the lenses selected for the correction. Furthermore, such an actuator can also be such that it effects a deformation of the lens.

In summary, the projection objective 10 in accordance with FIG. 1 therefore has a mirror CM in the vicinity of a pupil plane $P_2$ and two mirrors $M_{31}$, $M_{33}$ in the vicinity of field planes $F_2$, $F_3$ of the projection objective. The ratios $VM_1$ and $VM_2$ have different signs on the mirrors $M_{31}$, $M_{33}$. Optically operative lens surfaces of the projection objective 10 that are arranged in the vicinity of a pupil plane $P_1$ to $P_3$ are selected for correcting deformations of the mirror CM. Such optically operative surfaces of the lenses of the projection objective 10 that are stationed in the vicinity of the field planes $F_1$ to $F_4$ of the projection objective 10 are selected for correcting image defects caused by deformations of the mirrors $M_{31}$ and $M_{33}$, the ratios VL of principal ray height to marginal ray height on these lens surfaces having different signs.

Those lenses that can be selected as correction lenses are darkened in FIG. 1 and denoted as $K_{31}$, $K_{31'}$, $K_{32}$, $K_{32'}$, $K_{33}$, $K_{33'}$, and $K_{33''}$. The correction lenses are also darkened in the following figures and provided with "K".

Figure 2:
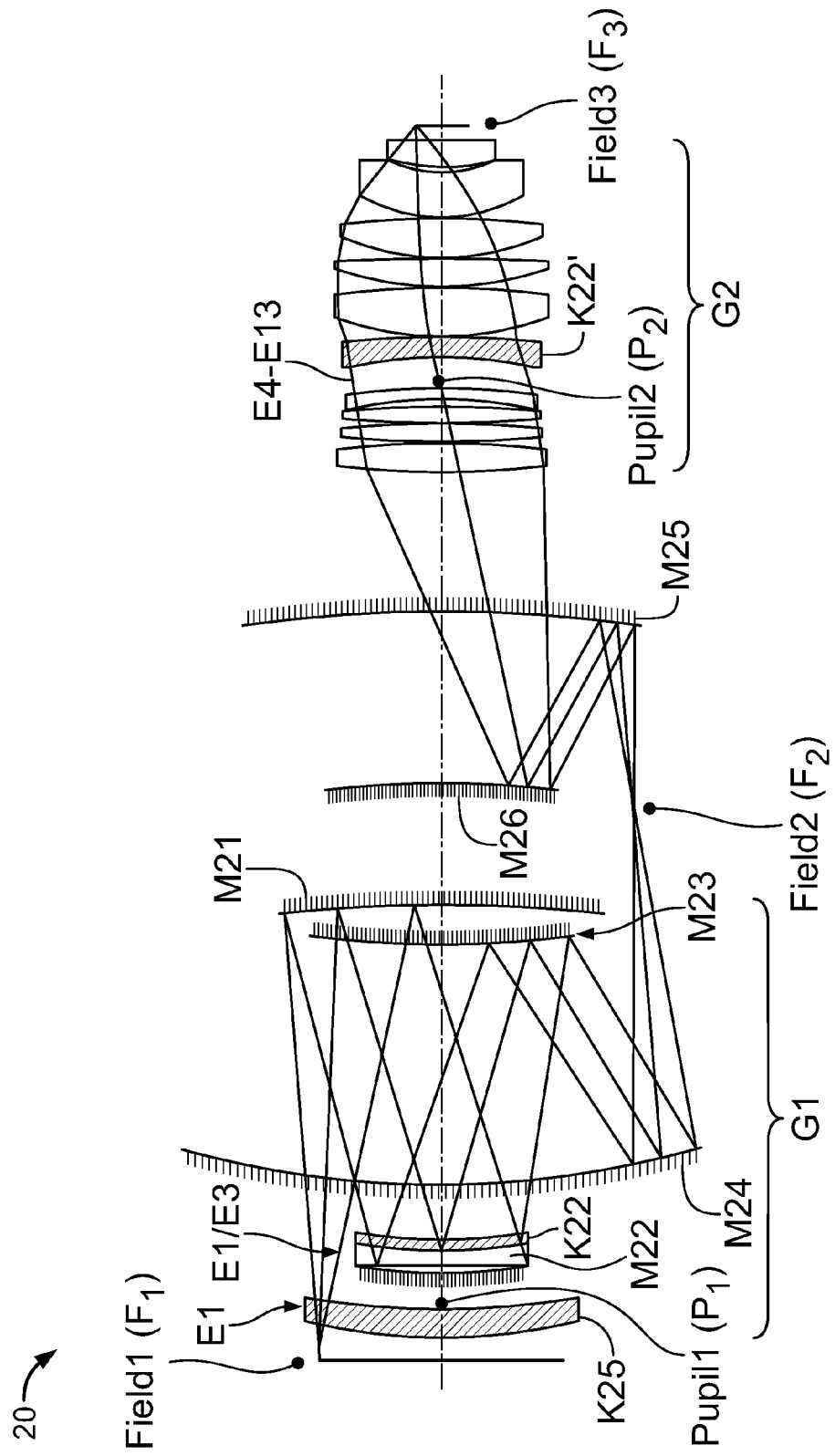
FIG. 2 shows a catadioptric projection objective in accordance with a second exemplary embodiment.

Illustrated in FIG. 2 is a projection objective that is provided with the general reference numeral 20 and has lenses $E_1$ to $E_{13}$ as well as six mirrors $M_{21}$ to $M_{26}$. Reference is made to document WO 02/44786 A2 for a detailed description of this projection objective 20.

The projection projective 20 has a field plane $F_1$ (object plane), a field plane $F_2$ (intermediate image plane) and a field plane $F_3$ (image plane). Furthermore, the projection objective 20 has a pupil plane $P_1$ and a pupil plane $P_2$.

The following therefore results in the case of determining the position of the mirrors $M_{21}$ to $M_{26}$ with regard to the ratio VM of principal ray height $h_MH$ to marginal ray height $h_MR$ at the respective optically active surfaces of the mirrors $M_{21}$ to $M_{26}$: at least the mirror $M_{22}$ is near-pupil, since it is located in the vicinity of the pupil plane $P_1$, and at least the mirror $M_{25}$ is near-field.

One of the lens surfaces (or both) of the lens $K_{22}$ (=$E_3$) or of the lens $K_{22'}$ (=$E_8$), for example, can be selected for correcting or compensating deformations on the optically operative surface of the mirror $M_{22}$ and image defects caused thereby. The rear lens surface of the lens $K_{25}$ (=$E_1$), for example, can be selected for correcting the mirror $M_{25}$. In summary, it holds for the projection objective 20 that the mirror $M_{22}$ is near-pupil, and that the mirror $M_{25}$ is near-field. At least one lens surface that is stationed in the vicinity of a pupil plane of the projection objective 20, and a lens surface that is stationed in the vicinity of a field plane of the projection objective 20 and whose ratio of principal ray height to marginal ray height corresponds in terms of the sign to the corresponding ratio of the mirror $M_{25}$ are selected for correcting possible deformations on the above-named mirrors. The correction of the projection objective 20 is followed, in turn, preferably by providing an aspherization on the selected lens surfaces, and/or by assigning actuators to the lenses that have these lens surfaces such that the lenses selected for correction can be tilted and/or displaced and/or deformed.

The method according to the invention can also be applied to such projection objectives whose optical arrangement has at least two mirrors that are stationed in the vicinity of at least one pupil plane of the projection objective, and at which the ratios $VM_1$ and $VM_2$ have different signs, at least two lens surfaces being selected for the correction that are arranged in the vicinity of at least one pupil plane of the projection objective 20, and at which the ratios $VL_1$ and $VL_2$ have different signs.

In the same way, the method according to the invention can be applied to a projection objective that has an optical arrangement composed of at least two mirrors that are arranged in the vicinity of at least one field plane of the projection objective, and at which the ratios $VM_1$ and $VM_2$ have the same sign, in this case at least one lens surface being selected for the correction that is arranged in the vicinity of a field plane of the projection objective and at which the ratio VL has the same sign as the ratios $VM_1$ and $VM_2$.

Figure 3:
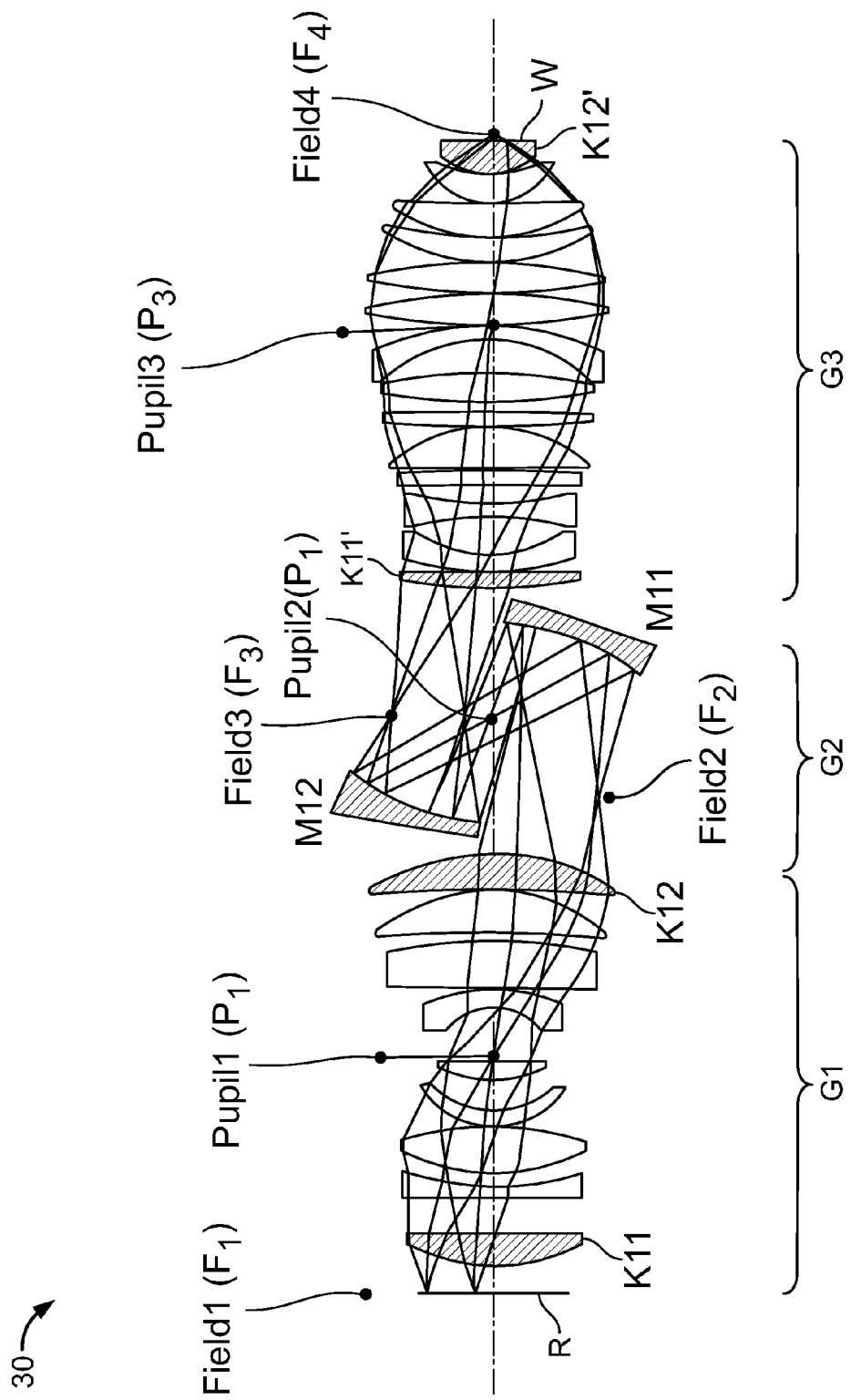
FIG. 3 shows a catadioptric projection objective in accordance with a third exemplary embodiment.

A further projection objective provided with the general reference numeral 30 is illustrated in FIG. 3.

The projection objective 30 has a first, purely dioptric part $G_1$ that images the object plane R onto a first intermediate image (field 2 ($F_2$)) via a first pupil plane $P_1$. The projection objective 30 further has a second, catoptric part $G_2$ that comprises mirrors $M_{11}$ and $M_{12}$ and which images the first intermediate image $F_2$ onto a second intermediate image (field 3 ($F_3$)) via a second pupil plane $P_2$. The two mirrors $M_{11}$ and $M_{12}$ are concave mirrors and are arranged near-field and are situated upstream and downstream, respectively, of the second pupil plane $P_2$.

The projection objective 30 further has a third, dioptric part $G_3$ that images the second intermediate image $F_3$ onto the image plane W via a third pupil plane $P_3$.

The near-field lens $K_{11}$ upstream of the first pupil plane $P_1$ can be selected as correction lens for correcting aberrations that can be caused by the mirror $M_{11}$. In addition or as an alternative thereto, the near-field correction lens $K_{11'}$ downstream of the second intermediate image $F_3$ and upstream of the third pupil plane $P_3$ can be used for correcting aberrations caused by the mirror $M_{11}$.

Moreover, the near-field lens $K_{12}$ downstream of the first pupil plane $P_1$ and upstream of the first intermediate image $F_2$, and/or the near-field lens $K_{12'}$ downstream of the third pupil plane $P_3$ are used for correcting aberrations that are caused by the mirror $M_{12}$.

The lenses $K_{11}$, $K_{11'}$, $K_{12}$, $K_{12'}$ can be lenses with at least one surface provided for the aspherization, and/or the lenses that can be varied in their position and/or are deformable.

Figure 4:
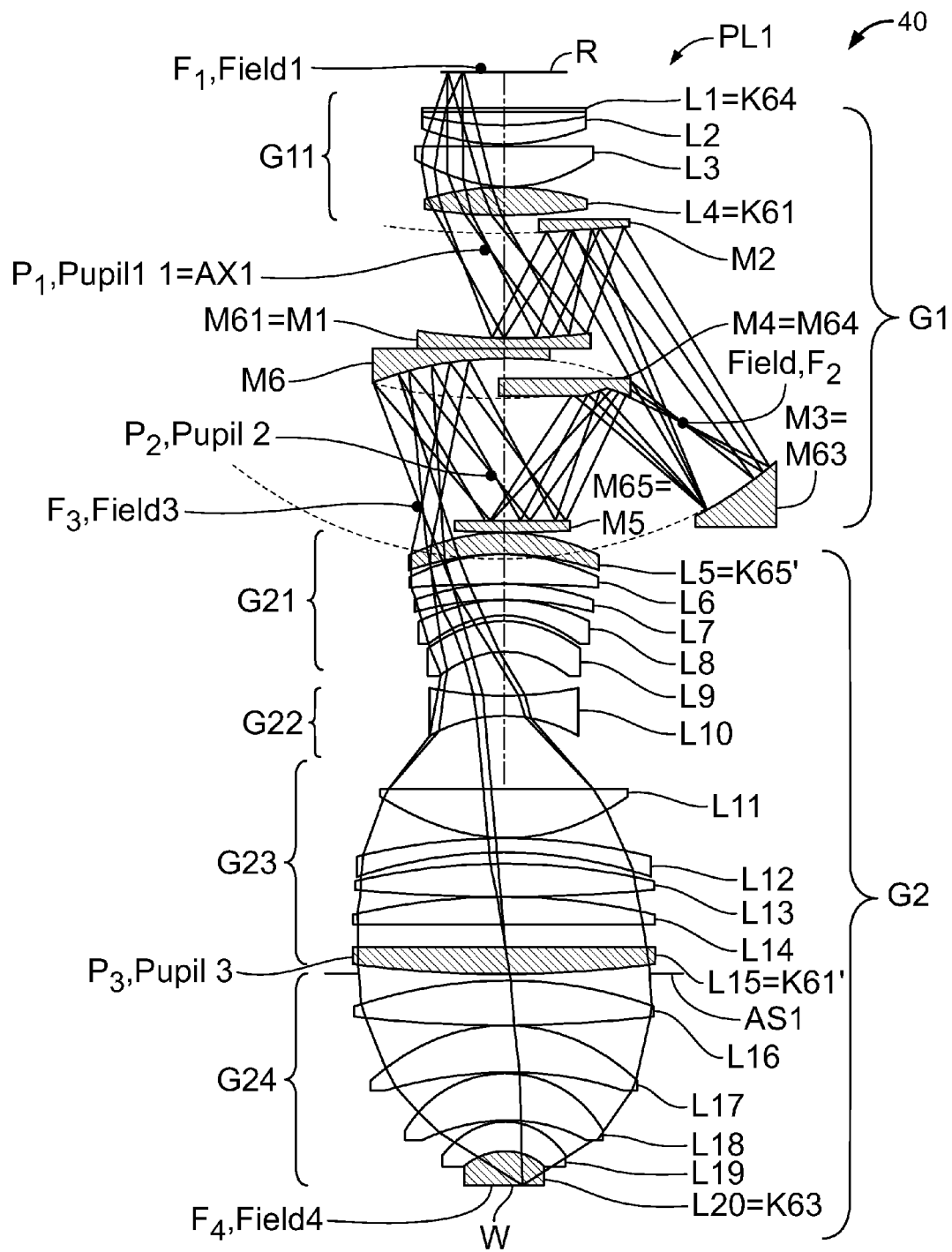
FIG. 4 shows a catadioptric projection objective in accordance with a fourth exemplary embodiment.

A projection objective provided with the general reference numeral 40 and that is described in more detail in WO 2004/107011, FIG. 14, with regard to the principle of its design, is illustrated in FIG. 4. To this extent, reference is made to that document.

In the direction of light propagation, the projection objective 40 has a first, catadioptric part with elements $L_1$ to $M_{63}$ that images the object plane R onto a first intermediate image $F_2$ via a first pupil plane $P_1$ and that includes at least one near-pupil mirror $M_{61}$ and at least one near-field mirror $M_{63}$ downstream of the first pupil plane $P_1$.

The projection objective 40 further has a second, catoptric part with elements $M_{64}$ to $M_{66}$ that images the first intermediate image $F_2$ onto a second intermediate image $F_3$ via a second pupil plane $P_2$ and includes at least one near-field mirror $M_{64}$ and a near-pupil mirror $M_{65}$.

Finally, the projection objective 40 has a third, dioptric part that comprises lenses $L_5$ to $L_{20}$ and images the second intermediate image $F_3$ onto the image W (field 4) via a third pupil plane $P_3$.

A near-field correction lens $K_{63}$ (=$L_{20}$) downstream of the third pupil plane $P_3$ is provided for "correcting the near-field mirror $M_{63}$" (which more accurately means that image defects caused by the mirror $M_{63}$ are corrected. The same or similar expression used in the description of the afore-going embodiments and those to be described below and as used in the claims is to be understood in the same sense), and a near-field correction lens $K_{65}$ (=$L_1$) is provided upstream of the first pupil plane $P_1$ for correcting the mirror $M_{65}$.

Additionally or as an alternative, a near-field correction lens $K_{65'}$ (=$L_5$) is provided downstream of the second intermediate image $F_3$ and upstream of the third pupil plane $P_3$ for correcting the mirror $M_{65}$, and a near-pupil correction lens $K_{61}$ (=$L_4$) is provided in the vicinity of the first pupil plane $P_1$ for correcting the mirrors $M_{61}$ and $M_{65}$, it being possible additionally or as an alternative to provide a near-pupil correction lens $K_{61'}$ (=$L_{15}$) in the vicinity of the third pupil plane $P_3$ for correcting the mirrors $M_{61}$ and $M_{65}$.

The correction lenses $K_{61}$ to $K_{65'}$ are lenses with at least one surface provided for the aspherization, and/or lenses that can be varied in their position, and/or deformable lenses.

Figure 5:
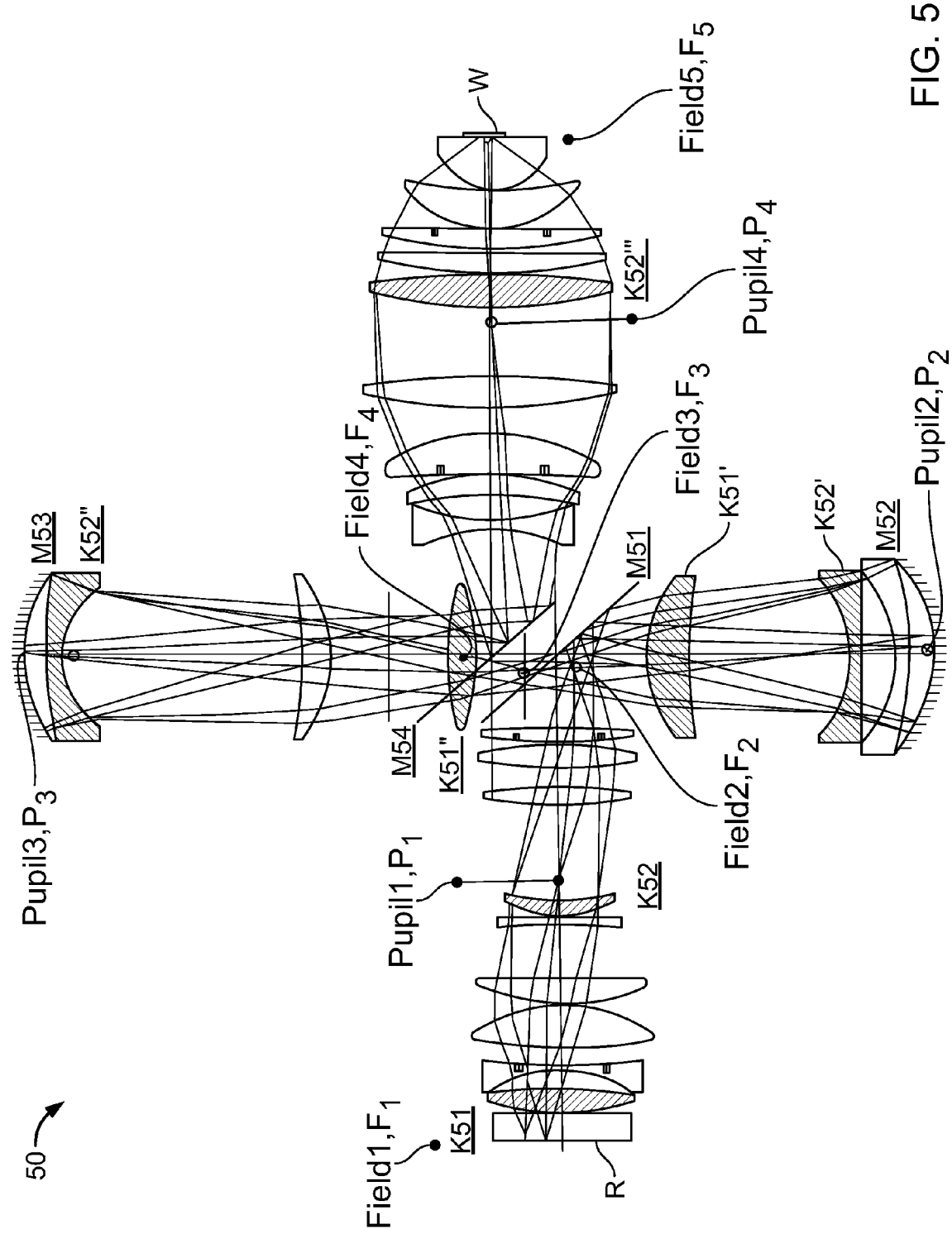
FIG. 5 shows a catadioptric projection objective in accordance with a fifth exemplary embodiment.

A further projection objective that is provided with the general reference numeral 50 is illustrated in FIG. 5.

Starting from the object plane R, the projection objective 50 has a first, dioptric part that images the object plane R onto a first intermediate image $F_2$ via a first pupil plane $P_1$. Adjoining the first, dioptric part, the projection objective 50 then has a second, catadioptric part that images the first intermediate image $F_2$ onto a second intermediate image $F_3$ via a second image plane $P_2$ and which includes at least one near-field mirror $M_{51}$ upstream of the second pupil plane $P_2$ and at least one near-pupil mirror $M_{52}$.

In its further course, the projection objective 50 has a third, catadioptric part that images the second intermediate image $F_3$ onto a third intermediate image $F_4$ via a third pupil plane $P_3$, and a near-pupil mirror $M_{53}$.

Finally, the projection objective 50 has a fourth, catadioptric part that images the third intermediate image $F_4$ onto the image plane W (=$F_5$) via a fourth pupil plane $P_4$ and which includes a near-field mirror $M_{54}$ upstream of the fourth pupil plane $P_4$.

A near-field correction lens $K_{51}$ is provided upstream of the first pupil plane $P_1$ for correcting the mirrors $M_{51}$ and $M_{54}$.

In addition or as an alternative, a near-field correction lens $K_{51'}$ is provided downstream of the first intermediate image $F_2$ and upstream of the second pupil plane $P_2$ for correcting the mirrors $M_{51}$ and $M_{54}$.

Furthermore, in addition or as an alternative, a near-field correction lens $K_{51''}$ is provided downstream of the second intermediate image $F_3$ and upstream of the third pupil plane $P_3$ for correcting the mirrors $M_{51}$ and $M_{54}$.

A near-pupil correction lens $K_{52}$ is provided in the vicinity of the first pupil plane $P_1$ for correcting the mirrors $M_{52}$ and $M_{53}$.

In addition or as an alternative, a near-pupil correction lens $K_{52'}$ is provided in the vicinity of the second pupil plane $P_2$ for correcting the mirrors $M_{52}$ and $M_{53}$.

Moreover, in addition or as an alternative, a near-pupil correction lens $K_{52''}$ is provided in the vicinity of the third pupil plane $P_3$ for correcting the mirrors $M_{52}$ and $M_{53}$.

Furthermore, in addition or as an alternative a near-pupil correction lens $K_{52'}$ is provided in the vicinity of the fourth pupil plane $P_4$ for correcting the mirrors $M_{52}$ and $M_{53}$.

The correction lenses $K_{51}$ to $K_{52'}$ are lenses with at least one surface provided for the aspherization, and/or lenses that can be varied in their position, and/or deformable lenses.

Figure 6:
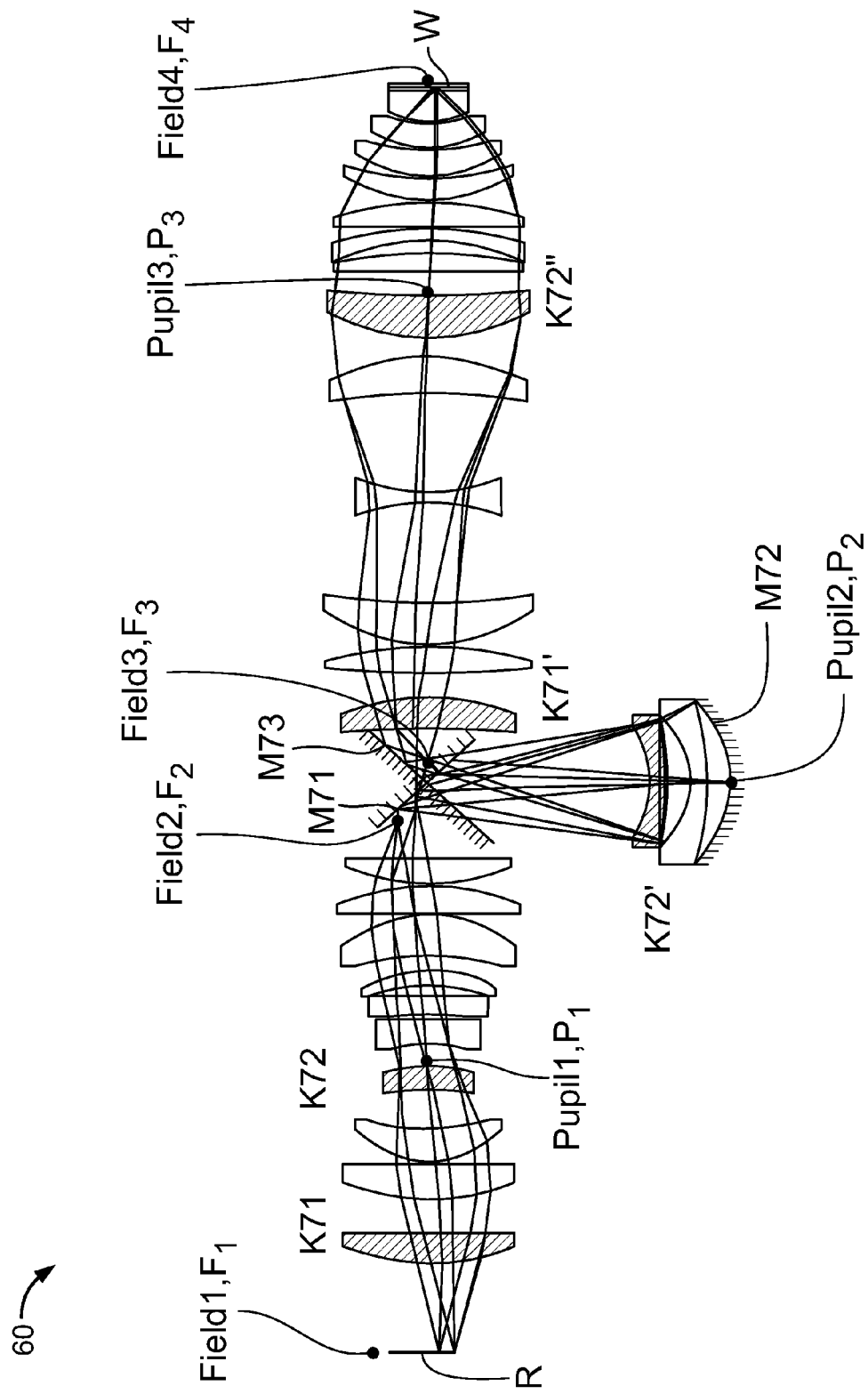
FIG. 6 shows a catadioptric projection objective in accordance with a sixth exemplary embodiment.

FIG. 6 illustrates a further projection objective that is provided with the general reference numeral 60. Reference may be made to WO 2004/019128 for a description of the design principle of this projection objective. The projection objective 60 is a variant of the design of the projection objective 10 in FIG. 1. Correspondingly, it has a first, dioptric part that images the object plane onto a first intermediate image $F_2$ via a first pupil plane $P_1$. Moreover, the projection objective 60 has a second, catadioptric part that images the first intermediate image $F_2$ onto a second intermediate image $F_3$ via a second pupil plane $P_2$ and which has a first near-field mirror $M_{71}$ upstream of the second pupil plane $P_2$, and a near-pupil mirror $M_{72}$. Finally, the projection objective 60 has a third catadioptric part that images the second intermediate image $F_3$ onto the image W ($F_4$) via a third pupil plane $P_3$, and includes a second near-field mirror $M_{73}$ upstream of the third pupil plane $P_3$. The mirrors $M_{71}$ and $M_{73}$ are folding mirrors like the mirrors $M_{31}$ and $M_{33}$, and the mirror $M_{72}$ is a concave mirror.

A correction lens $K_{71}$ is provided upstream of the first pupil plane $P_1$ for correcting the first mirror $M_{71}$ and third mirror $M_{73}$. In addition or as an alternative, a near-field correction lens $K_{71'}$ is provided downstream of the second field plane $F_3$ (second intermediate image) and upstream of the third pupil plane $P_3$ for correcting the mirror $M_{71}$ and the mirror $M_{73}$. A near-pupil lens $K_{72}$ is provided in the vicinity of the first pupil plane $P_1$, and/or a near-pupil lens $K_{72'}$ is provided in the vicinity of the second pupil plane $P_2$, and/or a near-pupil lens $K_{72''}$ is provided in the vicinity of the third pupil plane $P_3$ for correcting the mirror $M_{72}$.

The correction lenses $K_{71}$ to $K_{72''}$ can be lenses with at least one surface provided for the aspherization, and/or lenses that can be varied in their position, and/or deformable lenses.

Figure 7:
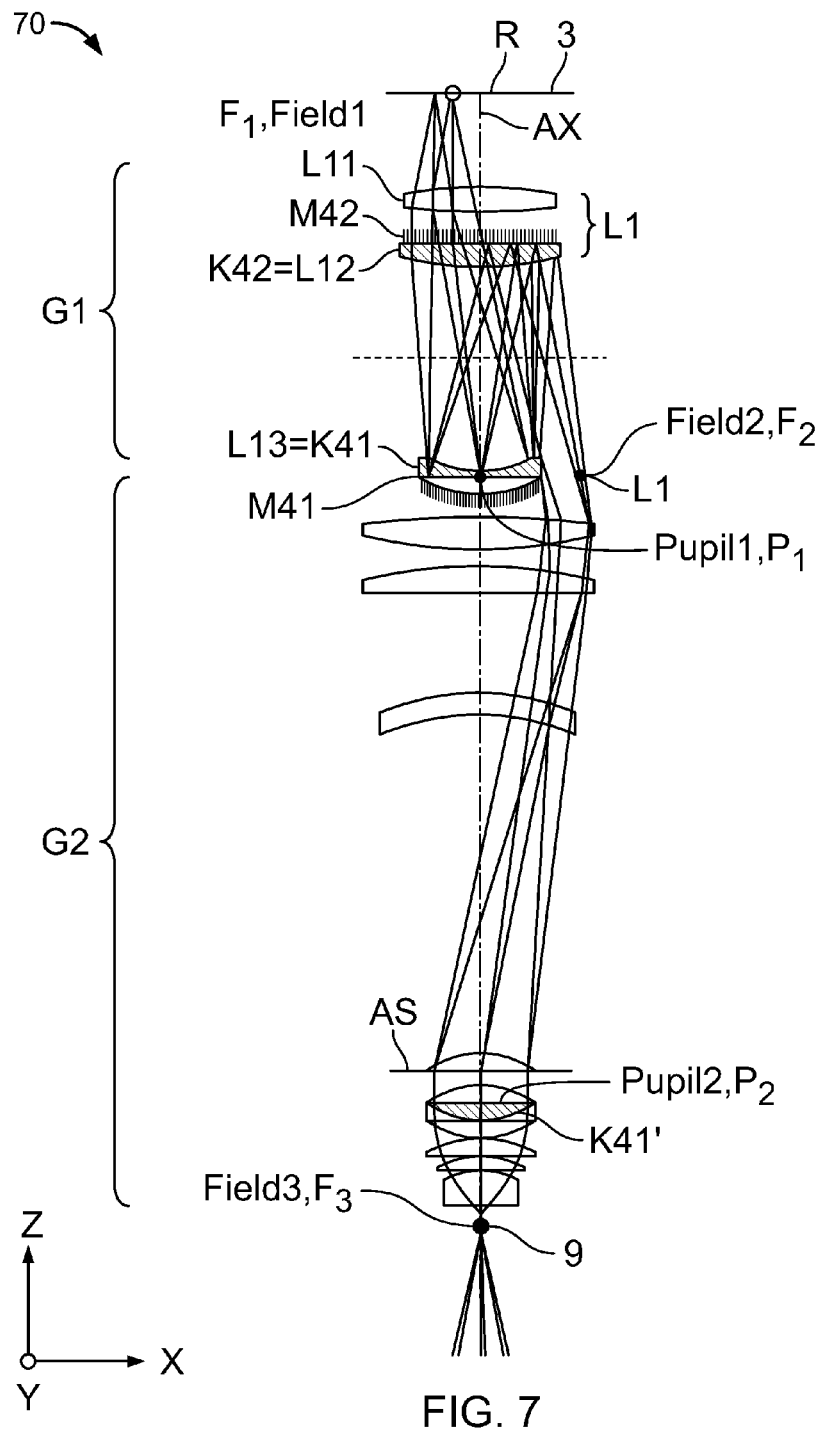
FIG. 7 shows a catadioptric projection objective in accordance with a seventh exemplary embodiment.

Finally, FIG. 7 illustrates a projection objective provided with the general reference numeral 70 and which is described in more detail in document EP 1 318 425 A2 with regard to its design principle, to which extent reference is made to it.

The projection objective 70 has a first catadioptric part with elements $L_{11}$ to $M_{42}$ that images the object plane R onto a first intermediate image $F_2$ via a first pupil plane $P_1$, and at least one near-pupil mirror $M_{41}$ and at least one near-field mirror $M_{42}$ downstream of the first pupil plane $P_1$. Moreover, the projection objective 70 has a second, dioptric part that images the intermediate image $F_2$ onto the image (field 3) via a second pupil plane $P_2$.

A near-pupil correction lens $K_{41}$ (=$L_{13}$) is provided in the vicinity of the first pupil plane $P_1$ for correcting the mirror $M_{41}$. As an alternative or in addition, a near-pupil correction lens $K_{41'}$ is provided in the vicinity of the second pupil plane $P_2$ for correcting the mirror $M_{41}$.

A near-field correction lens $K_{42}$ (=$L_{12}$) is provided downstream of the first pupil plane $P_1$ and upstream of the intermediate image $F_2$ for correcting the mirror $M_{42}$.

The correction lenses $K_{41}$, $K_{41'}$, $K_{42}$ can be lenses with at least one surface provided for the aspherization, and/or lenses that can be varied in their position, and/or deformable lenses.

What is claimed is:

1. A method, comprising:
   providing a projection objective, comprising:
   a first mirror having an optically operative surface with a defect; and
   a plurality of lenses;
   determining a ratio $VM_1$, of principal ray height $h_MH$ to marginal ray height $h_MR$, at the optically operative surface of the first mirror;
   selecting a first lens of the plurality of lenses, the first lens having an optically operative surface with a ratio $VL_1$, of principal ray height $h_LH$ to marginal ray height $h_LR$ that is closest to the ratio $VM_1$, when compared to a ratio $VL$ of the other lens surfaces; and
   modifying the optically operative surface of the first lens to compensate for an image defect caused by the defect in the optically operative surface of the mirror.

2. The method of claim 1, wherein the ratio $VL_1$ has a same sign as the ratio $VM_1$.

3. The method of claim 2, wherein the first mirror is arranged in the vicinity of a field plane of the projection objective.

4. The method of claim 1, wherein the optically operative surface of the first mirror is arranged in the vicinity of a pupil plane of the projection objective, and the optically operative surface of the first lens is arranged in the vicinity of a pupil plane of the projection objective.

5. The method of claim 1, wherein:
the projection objective further comprises a second mirror having an optically operative surface with a defect,
the second mirror has a ratio $VM_2$, of principal ray height $h_M H$ to marginal ray height $h_M R$, at the optically operative surface of the second mirror;
$VM_1$ and $VM_2$ have different signs;
the plurality of lenses comprises a second lens having an optically operative surface with a ratio $VL_2$, of principal ray height $h_L H$ to marginal ray height $h_L R$ at the optically operative surface of the second lens,
the second lens surfaces has a ratio $VL_2$ that is closest to the ratio $VM_2$, when compared to a ratio VL of the other lens surfaces; and
the ratios $VL_1$ and $VL_2$ have different signs and are selected to compensate for image defects caused by the defect in the optically operative surface of the first mirror and the defect in the optically operative surface of second mirror.

6. The method of claim 1, wherein:
the projection objective further comprises a second mirror having an optically operative surface with a second defect,
the second mirror has a $VM_2$, of principal ray height $h_M H$ to marginal ray height $h_M R$, at the optically operative surface of the second mirror;
$VM_1$ and $VM_2$ have identical signs;
a second lens surfaces has a ratio $VL_2$, of principal ray height $h_L H$ to marginal ray height $h_L R$ at the optically operative of the second lens,
the second lens surfaces has a ratio $VL_2$ that is closest to the ratio $VM_2$, when compared to a ratio VL of the other lens surfaces; and
the ratios $VL_1$ and $VL_2$ have the same sign and are selected to compensate for the image defects caused by the defect on the first mirror and the second defect on the second mirror.

7. The method of claim 1, wherein the ratio $VL_1$ deviates from the ratio $VM_1$ by less than 20%.

8. The method of claim 1, wherein modifying the optically operative surface of the first lens comprises introducing a local aspherization into the optically operative surface of the first lens.

9. The method of claim 1, wherein modifying the optically operative surface of the first lens comprises positionally adjusting the optically operative surface of the first lens.

10. The method of claim 1, wherein modifying the optically operative surface of the first lens comprises deforming the optically operative surface of the first lens.

11. The method of claim 1, wherein the projection comprises the following sequence of optically operative subassemblies in the sense of light passage:
a first, dioptric part that images an object plane onto a first intermediate image via a first pupil plane,
a second, catoptric part that images the first intermediate image onto a second intermediate image via a second pupil plane, and which includes a first and a second near-field concave mirror, the first and the second near-field concave mirrors are upstream and downstream of the second pupil plane, respectively,
a third, dioptric part that images the second intermediate image onto an image plane via a third pupil plane,
wherein at least one of the following is met:
a near-field correction lens, provided to compensate an image defect caused by a defect in an optically operative surface of the first concave mirror, is arranged upstream of the first pupil plane,
a near-field correction lens, provided to compensate an image defect caused by a defect in an optically operative surface of the first concave mirror, is arranged downstream of the second intermediate image and upstream of the third pupil plane,
a near-field correction lens, provided to compensate an image defect caused by a defect in an optically operative surface of the second concave mirror is arranged downstream of the first pupil plane and upstream of the first intermediate image,
a near-field correction lens, provided to compensate an image defect caused by a defect in an optically operative surface of the second concave mirror is arranged downstream of the third pupil plane.

12. The method of claim 1, wherein the projection objective comprises the following sequence of optically operative subassemblies in the sense of light passage:
a first, catadioptric part that images an object plane onto an intermediate image via a first pupil plane, and which includes an even number of at least two mirrors of which at least one first mirror is near-pupil,
a second, catadioptric part that images the intermediate image onto an image via a second pupil plane and includes a second near-field mirror,
wherein at least one of the following is met:
a near-pupil correction lens provided to compensate an image defect caused by a defect in the optically operative surface of the first mirror is provided in vicinity of the first pupil plane,
a near-pupil correction lens, provided to compensate an image defect caused by a defect in the optically operative surface of the first mirror, is provided in vicinity of the second pupil plane, and
a near-field correction lens, provided to compensate an image defect caused by a defect in an optically operative surface of the second mirror is provided upstream of the first pupil plane.

13. The method of claim 1, wherein the projection objective comprises the following sequence of optically operative subassemblies in the sense of light passage:
a first, catadioptric part that images an object plane onto a first intermediate image via a first pupil plane and which includes a first, near-field mirror downstream of the first pupil plane,
a second, catadioptric part that images the first intermediate image onto a second intermediate image via a second pupil plane and which includes a second, near-pupil mirror,
a third, catadioptric part that images the second intermediate image onto an image via a third pupil plane and which includes a third, near-field mirror upstream of the third pupil plane,
wherein at least one of the following is met:
a near-field correction lens, provided to compensate an image defect caused by a defect in the optically operative surface of the first mirror, is provided downstream of the first pupil plane and upstream of the first intermediate image, a near-field correction lens, provided to compensate an image defect caused by a defect in the optically operative surface of the first mirror, is provided downstream of the third pupil plane, a near-field correction lens, provided to compensate an image defect caused by a defect in an optically operative surface of the third mirror, is provided upstream of the first pupil plane, a near-field correction lens, provided to compensate an image defect caused by a defect in an optically operative surface of the third mirror, is provided downstream of the second intermediate image and upstream of the third pupil plane, a near-pupil correction lens, provided to compensate an image defect caused by a defect in an optically operative surface of the second mirror, is provided in vicinity of the first pupil plane, a near-pupil correction lens, provided to compensate an image defect caused by a defect in an optically operative surface of the second mirror, is provided in vicinity of the second pupil plane, and a near-pupil correction lens, provided to compensate an image defect caused by a defect in an optically operative surface of the second mirror, is provided in vicinity of the third pupil plane.

14. The method of claim 1, wherein the projection objective comprises the following sequence of optically operative subassemblies in the sense of light passage:

a first catadioptric part that images an object plane onto a first intermediate image via a first pupil plane, and which includes a first, near-pupil mirror and a second, near-field mirror, the latter being arranged downstream of the first pupil plane;

a second, dioptric part that images the intermediate image onto an image via a second pupil plane, wherein at least one of the following is met:

a near-pupil correction lens, provided to compensate an image defect caused by a defect in an optically operative surface of the first mirror, is provided in vicinity of the first pupil plane, a near-pupil correction lens, provided to compensate an image defect caused by a defect in an optically operative surface of the first mirror, is provided in vicinity of the second pupil plane, and a near-field correction lens, provided to compensate an image defect caused by a defect in an optically operative surface of the second mirror, is provided downstream of the first pupil plane and upstream of the intermediate image.

15. The method of claim 1, wherein the projection objective comprises the following sequence of optically operative subassemblies in the sense of light passage:

a first, dioptric part that images an object plane onto a first intermediate image via a first pupil plane, a second, catadioptric part that images the first intermediate image onto a second intermediate image via a second pupil plane and which includes a first, near-field mirror upstream of the second pupil plane, and a second, near-pupil mirror, a third, catadioptric part that images the second intermediate image onto a third intermediate image via a third pupil plane and which includes a third, near-pupil mirror, a fourth, catadioptric part that images the third intermediate image onto an image via a fourth pupil plane and which includes a fourth, near-field mirror upstream of the fourth pupil plane, wherein at least one of the following is met:

a near-field correction lens, provided to compensate image defects caused by defects in optically operative surfaces of the first and fourth mirrors is provided upstream of the first pupil plane, a near-field correction lens provided to compensate image defects caused by defects in optically operative surfaces of the first and fourth mirrors, is provided downstream of the first intermediate image and upstream of the second pupil plane, a near-field correction lens, provided to compensate image defects caused by defects in optically operative surfaces of the first and fourth mirrors, is provided downstream of the second intermediate image and upstream of the third pupil plane, a near-pupil correction lens, provided for compensate image defects caused by defects in optically operative surfaces of the second and third mirrors, is provided in vicinity of the first pupil plane, a near-pupil correction lens, provided to compensate image defects caused by defects in optically operative surfaces of the second and third mirrors, is provided in vicinity of the second pupil plane, a near-pupil correction lens, provided to compensate image defects caused by defects in optically operative surfaces of the second and third mirrors, is provided in vicinity of the third pupil plane, and a near-pupil correction lens, provided to compensate image defects caused by defects in optically operative surfaces of the second and third mirrors, is provided in vicinity of the fourth pupil plane.

16. The method of claim 1, wherein the projection objective comprises the following sequence of optically operative subassemblies in the sense of light passage:

a first, catadioptric part that images an object plane onto a first intermediate image via a first pupil plane and which includes a first, near-pupil mirror and includes at least one second, near-field mirror, the latter being arranged downstream of the first pupil plane, a second, catoptric part that images the first intermediate image onto a second intermediate image via a second pupil plane and which includes a third, near-field mirror upstream of the second pupil plane, and a fourth, near-pupil mirror, a third, dioptric part that images the second intermediate image onto an image via a third pupil plane, wherein at least one of the following is met:

a near-field correction lens, provided to compensate an image defect caused by a defect in an optically operative surface of the second mirror, is arranged downstream of the third pupil plane, a near-field correction lens, provided to compensate an image defect caused by a defect in an optically operative surface of the third mirror, is provided upstream of the first pupil plane, a near-field correction lens, provided to compensate an image defect caused by a defect in an optically operative surface of the third mirror, is a provided downstream of the second intermediate image and upstream of the third pupil plane, a near-pupil correction lens, provided to compensate an image defect caused by defects in optically operative surfaces of the mirrors, is provided in vicinity of the first pupil plane, and a near-pupil correction lens, provided to compensate an image defect caused by defects in optically operative surfaces of the mirrors, is provided in vicinity of the third pupil plane.

17. The method of claim 1, wherein the projection objective comprises the following sequence of optically operative subassemblies in the sense of light passage:
- a first, dioptric part that images an object plane onto a first intermediate image via a first pupil plane,
- a second, catadioptric part that images the first intermediate image onto a second intermediate image via a second pupil plane and which includes a first near-field mirror upstream of the second pupil plane, as well as a near-pupil mirror,
- a third, catadioptric part that images the second intermediate image onto an image via a third pupil plane and which includes a second near-field mirror upstream of the third pupil plane,
- wherein at least one of the following is met:
  - a near field correction lens provided to compensate image defects caused by defects in optically operative surfaces of the first and third mirrors, is provided upstream of the first pupil plane,
  - a near-field correction lens, provided to compensate image defects caused by defects in optically operative surfaces of the first and third mirrors, is provided downstream of the second intermediate image and upstream of the third pupil plane,
  - a near-pupil correction lens, provided for correcting an image defect caused by a defect in an optically operative surface of the second mirror, is provided in vicinity of the first pupil plane,
  - a near-pupil correction lens, provided to compensate an image defect caused by a defect in an optically operative surface of the second mirror, is provided in vicinity of the second pupil plane, and
  - a near-pupil correction lens, provided for correcting an image defect caused by a defect in an optically operative surface of the second mirror, is provided in vicinity of the third pupil plane.

18. The method of claim 1, further comprising using the projection objective to produce semiconductor structures.

19. The method of claim 1, wherein the defect in the optically operative surface of the first mirror is caused by a manufacturing process of the first mirror.

20. A method, comprising:
- providing a lithography projection exposure machine comprising a projection objective, the projection objective comprising:
  - a mirror having an optically operative surface with a defect; and
  - a plurality of lenses including a first lens having an optically operative surface; and
- determining a ratio VM, of principal ray height $h_M H$ to marginal ray height $h_M R$, at the optically operative surface of the mirror;
- selecting a first lens of the plurality of lenses, the first lens having an optically operative surface with a ratio VL, of principal ray height $h_L H$ to marginal ray height $h_L R$ that is closest to the ratio VM, when compared to a ratio VL of the other lens surfaces; and
- modifying the optically operative surface of the first lens to compensate for an image defect caused by the defect in the optically operative surface of the mirror.

21. The method of claim 20, further comprising using the projection objective to produce semiconductor structures.

* * * * *

UNITED STATES PATENT AND TRADEMARK OFFICE
CERTIFICATE OF CORRECTION

PATENT NO. : 8,174,676 B2
APPLICATION NO. : 13/187003
DATED : May 8, 2012
INVENTOR(S) : Wilhelm Ulrich It is certified that error appears in the above-identified patent and that said Letters Patent is hereby corrected as shown below:

In the Specification

Column 6,
Line 31, Delete "$S_{623,626}$" and insert --$S_{623,629}$--.

Column 10,
Line 43, Delete "$(=_{L12})$" and insert --$(=L_{12})$--.

Signed and Sealed this
Eleventh Day of November, 2014

Michelle K. Lee
*Deputy Director of the United States Patent and Trademark Office*